United States Patent

J'Afer et al.

Patent Number: 6,159,351
Date of Patent: Dec. 12, 2000

[54] MAGNET ARRAY FOR MAGNETRONS

[75] Inventors: Hussain J'Afer; John M Walls; Alaric G Spencer; Allen R Waugh; Norman H White, all of Whitwick, United Kingdom

[73] Assignee: Applied Vision Limited, United Kingdom

[21] Appl. No.: 09/155,636

[22] PCT Filed: Apr. 2, 1997

[86] PCT No.: PCT/GB97/00918

§ 371 Date: Apr. 23, 1999

§ 102(e) Date: Apr. 23, 1999

[87] PCT Pub. No.: WO97/37371

PCT Pub. Date: Oct. 9, 1997

[30] Foreign Application Priority Data

Apr. 2, 1996 [GB] United Kingdom .................. 9606920

[51] Int. Cl.[7] .................................................. C23C 14/34
[52] U.S. Cl. .............................. 204/298.19; 204/298.16; 204/298.17; 204/298.11; 204/192.12; 204/298.14
[58] Field of Search ..................... 204/298.19, 298.11, 204/298.14, 298.16, 192.12, 298.17

[56] References Cited

U.S. PATENT DOCUMENTS

| | | | |
|---|---|---|---|
| 4,060,470 | 11/1977 | Clarke | 204/192 |
| 4,407,708 | 10/1983 | Landau | 204/298.19 |
| 4,547,279 | 10/1985 | Kiyota et al. | 204/298 |
| 4,865,709 | 9/1989 | Nakagawa et al. | 204/298.19 |
| 4,966,677 | 10/1990 | Aichert et al. | 204/298.21 |
| 5,593,551 | 1/1997 | Lai | 204/192.12 |
| 5,643,427 | 7/1997 | Kobayashi et al. | 204/298.19 |
| 5,795,451 | 8/1998 | Tan et al. | 204/298.19 |
| 5,861,088 | 1/1999 | Curtins | 204/298.19 |

FOREIGN PATENT DOCUMENTS

| | | | |
|---|---|---|---|
| 0 492 992 A2 | 7/1992 | European Pat. Off. | H01J 37/34 |
| 59-173265 | 10/1984 | Japan | C23C 15/00 |
| 62218562 | 9/1987 | Japan | C23C 14/34 |
| 2 096 177 | 10/1982 | United Kingdom | C23C 15/00 |

*Primary Examiner*—Nam Nguyen
*Assistant Examiner*—Daborah Chacko-Davis
*Attorney, Agent, or Firm*—Zarley, McKee, Thomte, Voorhees & Sease

[57] ABSTRACT

The invention relates to improvements and the formation of magnetrons for use in sputter depositing material from a targeted material mounted therein. The improvement allows contamination of the target to be reduced in comparison to those of conventional magnetrons, arcing of the magnetron to be reduced, and the deficiency and quality of the coating process and target utilization to be enhanced by providing an array of magnets around the periphery of the target in addition to a first array of magnets to the rear of the target, thus causing the effect of the magnetic field on the target to be substantially uniform.

8 Claims, 2 Drawing Sheets

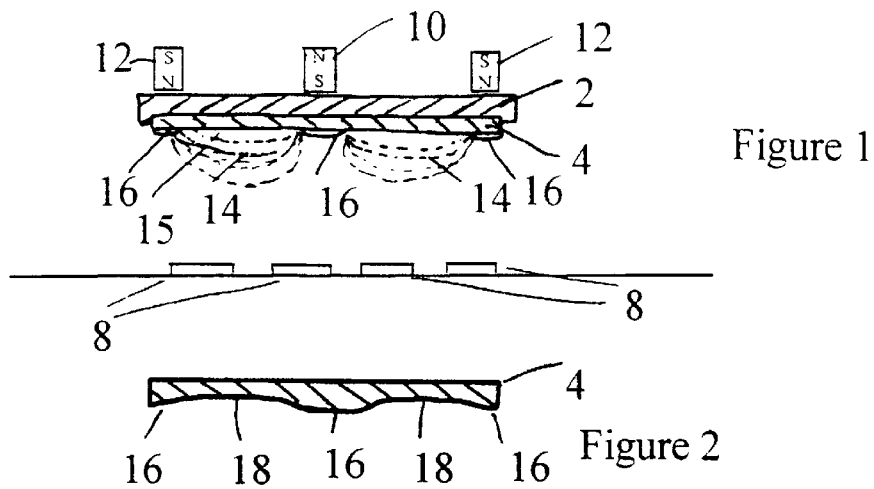
Figure 1
Figure 2
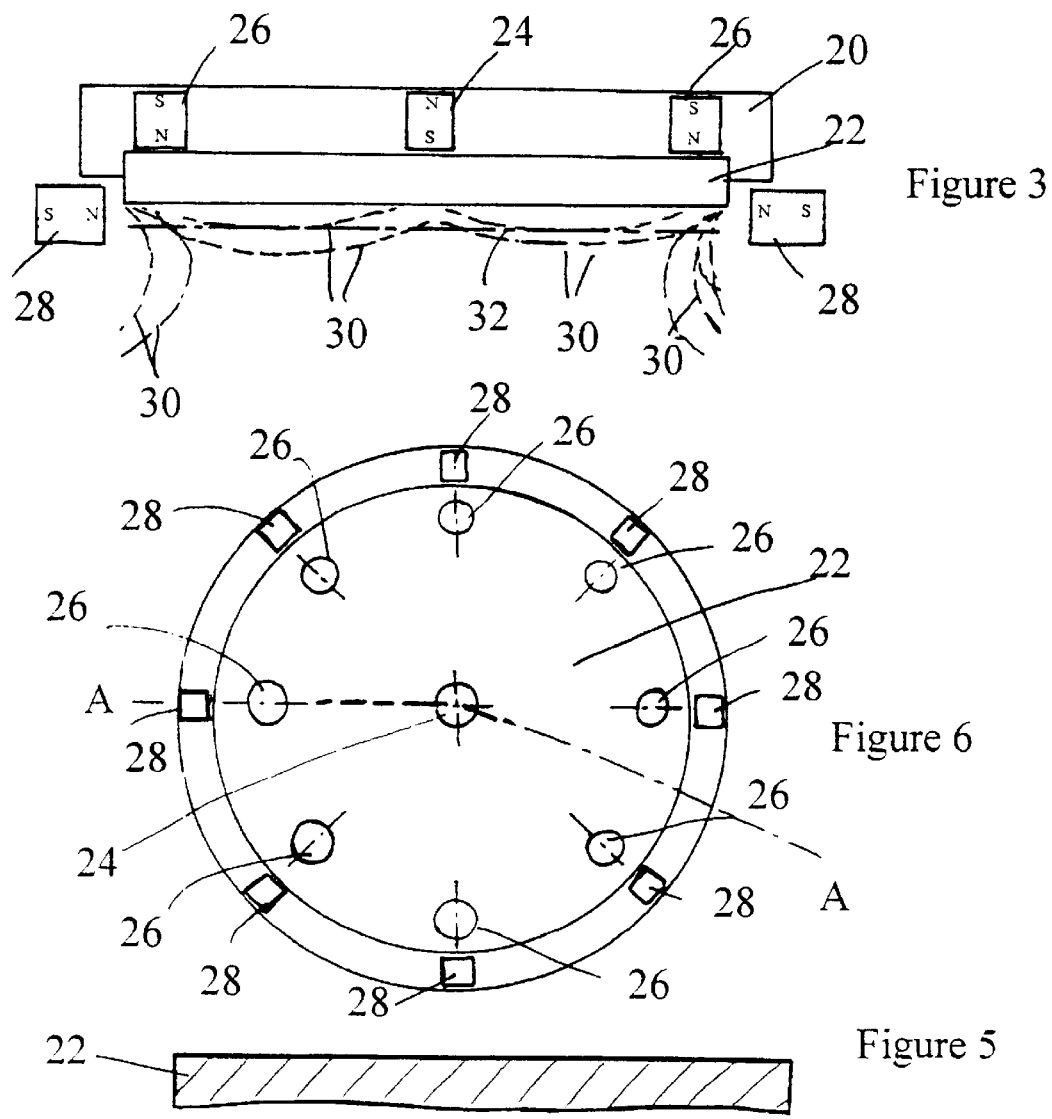
Figure 3
Figure 6
Figure 5

MAGNET ARRAY FOR MAGNETRONS

BACKGROUND OF THE INVENTION

The invention which is the subject of this application relates to improvements to the form and operation of magnetrons which can be operated for the sputter deposition of material from a target of said material when said magnetron is activated.

The sputtering of material targets from magnetrons is a well-known process for applying relatively thin, fine coatings onto substrates which are provided in proximity to said magnetrons. The coatings are compiled from the sputtered material and, if required, can be reacted with a gas plasma to provide a coating of required form. Furthermore, a plurality of magnetrons, having different target materials can be provided to be operated to form a multilayered coating of different materials on said substrates if required. There are many potential uses for the sputtering process such as, for example, the sputtering of coatings onto ophthalmic lens, light bulbs, semi-conductor devices, windows, compact discs and the like.

A problem with conventional sputtering magnetrons is the contamination of the targets of the material to be sputtered. This contamination can cause a build up of low energy back scattered material, i.e. material which is not successfully applied to the substrates to be coated, such as, for example, oxidised material on the surface of the target. Once the build up has reached a certain extent, the material can start to flake off the target during operation of the same and this flake material causes contaminants to fall from the target during operation onto the substrates and cause imperfections in the coatings formed which can mean that the substrates may have to be destroyed thereby adversely affecting production yield.

A further problem caused by the contamination is that arcing can occur between the contaminated areas of the target during operation and this arcing causes reduced efficiency of operation and can prevent the formation of coatings to the required consistency and quality.

Conventional magnetrons are typically provided with an array of magnets which comprise, for example for a circular magnetron, an annular array to the rear of the target and a centrally positioned magnet to the rear, with reverse polarity to the magnets in the annular array. Thus, all of the magnets are mounted behind the target in the magnetron body. The purpose of the magnets is to create a magnetic field across the surface of the target which causes sputtering of the target material when the magnetron is operated however, it is found that with this conventional magnet array, uneven erosion occurs on the surface of the target material which is being sputtered due to uneven strength of the magnetic field created across the surface of the target from which the material is sputtered. Thus, typically, the target material will be heavily eroded in an annular path where the magnetic field is strongest and straight, the outer limits of which are defined by the position of the magnets in the annular array and the inner limits of which is determined by the position of the centre magnet. The portion of the target material outside of this annular path is not eroded to the same extent, if at all, and it is in these areas that contamination and oxidation occur. Thus, the erosion across the surface of the target material is not uniform and hence wastage of material occurs and a reduction of the target material utilisation occurs.

SUMMARY OF THE INVENTION

The aim of the present invention is to provide a magnetron having a target material wherein said target contamination is greatly reduced in comparison to conventional magnetrons, arcing of the magnetron is reduced and the efficiency and quality of the coating process and target utilisation is enhanced.

In a first aspect of the invention there is provided a magnetron provided with a target of a material to be sputtered, a first magnet array mounted to the rear of said target for creating a magnetic field, when activated, across the surface of the target material to be sputtered and a power supply for the activation of the magnetron and characterised in that the magnetron further includes at, or depending from the periphery of the target, a second array of magnets spaced around the periphery of said target.

Typically the second array of magnets are provided in a side wall and, are positioned in the same plane as that of the target or at least partially to the front of the target.

Typically the magnets in the second array are provided at spaced intervals around the periphery of the target material and the spacing between said magnets is dependent upon the strength of the magnets provided and the shape and surface area of the target to be sputtered. Typically the strongest available magnets will be selected for use.

Typically the first and/or second magnet arrays are provided in a fixed arrangement therefore there is no need for the same to be moved during operation of the magnetron. It is found that this invention, including the addition of the magnet array to the side of the target material has the effect of creating a magnetic field across the surface of the target material and of spreading the effect of the field so as to minimise variation in the strength of the magnetic field at different locations. The provision of the more uniform magnetic field eliminates or at least greatly reduces the variation of erosion and the annular eroding effect which is created on the targets of conventional magnetrons and thus the magnetron of the invention erodes in a substantially uniform manner. Thus, the reduction in the erosion and also contamination means that the requirement to clean the surface area of the target from which the material is sputtered is much reduced. In the applicant's own sputtering equipment which is used to sputter material to coat opthalmic lens it has been found that when using conventional magnetron arrangements the same are required to be cleaned every 50 cycles of use whereas in test conditions using the magnetron of the form according to the invention, cleaning is only required event 700 to 800 cycles of use. Thus it will be appreciated that considerable savings in time and reduction in the wastage of material can be obtained. Typically the magnetron is arranged with a first magnet array including a centre magnet to the rear of the target with a first polarity relative to the target, and a series of magnets in an array spaced around the centre magnet to the rear of the target with a reverse polarity relative to the target, and a second magnet array with magnets provided to the side or periphery of the target, these magnets arranged with the same polarity relative to the target as the spaced series of magnets of the first array. This arrangement creates a magnetic field effect which is "pushed" towards the centre of the target surface and therefore the build up of contaminants at the centre which occurs with conventional magnetrons is reduced or even eliminated. Similarly the magnetic field created adjacent the periphery of the target and at the side of the magnetron allows the contamination build up in this area to be reduced.

It should be borne in mind that when the magnetron is operated the target is caused to sputter from the regions of the surface where the magnetic field created is sufficiently strong. Where the target is sputtered, build up of contaminants is much reduced and therefore by stretching the effect of the magnetic field across the entire surface of the target so that the sputtering occurs from substantially all of the surface area, contamination is decreased and hence the need to precondition or clean the targets prior to operation to remove contaminants is reduced. The ability to sputter material from all of the surface effectively causes the target to be self cleaning as it is operated.

The invention therefore provides a magnetron which has a central magnet to the rear of the target material and a magnet array around said centre magnet again at the rear of the target surface and there is provided a second array of magnets which is fitted in relation to the first array with the axes of these magnets parallel with the surface of the target. With the magnets in both arrays, with the exception of the centre magnet, having the same polarity, thus the magnetic field created is spread over and towards the target centre as it is attracted by the single magnet fitted behind the centre of the target with reverse polarity. This helps to produce a magnetic field which is effective across an area which is substantially the surface of the target and therefore improves the erosion profile of the same.

In a further aspect of the invention there is provided a magnetron having a target material for sputtering and means for activating the said magnetron and at least a first magnet array to create a magnetic field across substantially the surface of the target material to be sputtered and characterised in that the magnetron body is manufactured from an insulating material to prevent the body from being live during operation of the magnetron.

Typically, the insulating material used is Delrin and, in one embodiment, the target material is sandwiched between two parts and a power connection is provided such that no live exposure of the parts occurs and therefore the same can be touched by an operator, even during operation, safely.

Preferably, first and second magnet arrays are provided, with the magnets in the second array provided to lie with their axes parallel with the surface of the target.

In a further aspect of the invention there is provided a magnetron for operation to sputter material from a target mounted therein, said magnetron including a first, centrally mounted magnet to the rear of the target and at least a first array of magnets again mounted behind the target and a means for activating the magnetron and characterised in that the design includes an earthed shield which is mounted in front of the target surface to be sputtered, said shield preventing build up of sputtered material around the periphery of the target and/or the body of the magnetron.

Preferably the shield is used in conjunction with a magnetron body made from an insulating material and yet more preferably used in conjunction with the magnetron having a second array of magnets mounted around the side of the target material.

BRIEF DESCRIPTION OF THE DRAWINGS

FIG. 1 illustrates a schematic indication of the magnetic field created using a conventional magnetron;

FIG. 2 illustrates a cross section through a target material eroded using a conventional magnetron;

FIG. 3 illustrates a schematic diagram of a cross section of a magnetron according to the invention;

FIG. 5 illustrates a cross section through a target material of a magnetron of the present invention; and FIG. 6 illustrates a plan view of a magnetron section showing the magnet arrays of the invention.

DETAILED DESCRIPTION OF THE EMBODIMENTS

Figure 4:
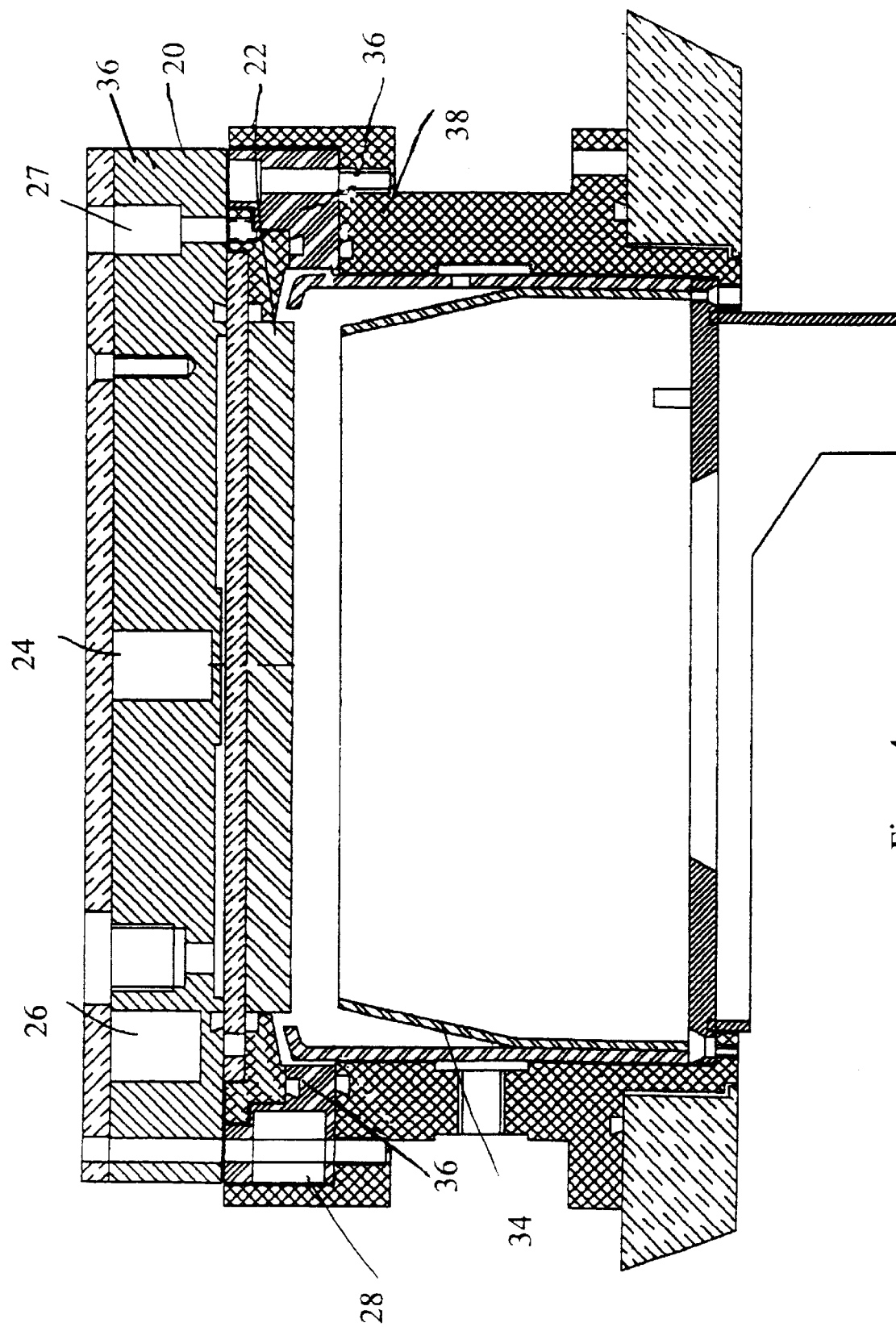
FIG. 4 illustrates a detailed view of one embodiment of the magnetron according to the invention in part section along line A—A of FIG. 6.

Referring firstly to FIGS. 1 and 2 there is illustrated a conventional magnetron 2 having a target material 4 for sputtering of material onto substrates 8 for forming a coating thereon. The magnetron is electrically activated and a magnetic field is created by the provision of an array of magnets comprising a centre magnet 10 mounted to the rear of the centre of the target material 4 and a series of magnets 12 mounted at the rear and spaced radially from the centre magnet. The polarity of the centre magnet is the reverse of the polarity of the magnets in the array 12 and hence the magnetic field 14 is created and is indicated in broken lines and extends to the front of the target to act on the surface 15 from which the material is sputtered. This magnetic field 14 can be seen to be non-uniform and does not affect all of the surface of the target and hence build up of contaminants 16 can occur. Typically, the contamination is in the form of oxidation of the target material and the oxidised material can cause arcing, flake off and cause problems with the coating quality. Thus the target surface is required to be cleaned at regular intervals thereby requiring the magnetron to be moved, the apparatus to be stopped and hence down time in the operation of the apparatus to be required. Furthermore the cleaning operation causes wastage of material as a layer of material is sputtered and removed to leave a clean fresh surface for sputtering onto the substrates.

Another factor of the uneven effect of the magnetic field is that an annular band of high erosion 18 is created where the effect of the magnetic field is strongest. Thus an uneven target surface is created with uneven use of the target material and this is shown in detail in FIG. 2 where there is shown a target which has been used in a conventional magnetron and which has been eroded unevenly.

Referring now to FIG. 3 there is shown a schematic diagram of a magnetron according to the invention. The magnetron includes a body 20 in which is mounted a target 22 of material to be sputtered. To the rear of the target is provided a first array of magnets comprising a centrally mounted magnet 24 with a first polarity relative to the target and a series of magnets 26 to the rear of the target with a reverse polarity to the centre magnet relative to the target. There is also provided a second array of magnets 28 to the side and around the periphery of the target 22 which are arranged with the same polarity relative to the target as the series of magnets 26 of the first array. The magnetic field 30 created by this arrangement is shown in broken lines and, as will be seen, the addition of the second array of magnets serves to "push" the effect of the magnet field towards the centre of the target material and thus a magnetic field effect as indicated by the line 32 is created in an area with a limit which is substantially parallel with the surface of the target. Thus, the effect of the second magnet array is to provide a magnetic field which is effective across substantially all of the target surface. This means that the material is sputtered from substantially all areas of the surface of the target to create a relatively even erosion pattern on the same and this is indicated in FIG. 5 where it can be seen that the eroded target has a significantly more even erosion pattern than the erosion pattern on the target of FIG. 2 using the conventional magnetron. The rear of the target 22 is shown in plan in FIG.

6 in schematic form and indicates the arrangement of the first magnet array including magnet 24 and series of magnets 26 to the rear of the target and the second array of magnets 28 around the periphery of the target. It should be noted that the series of magnets 26 and second array of magnets need not be provided in an annular arrangement, which in this case is provided as the target is circular in shape, but may be provided in whatever spaced arrangement is required to suit the shape of the target used and the size of the same.

Referring now to FIG. 4 there is illustrated a specific diagram of one embodiment of the invention and, using the same reference numerals as used in FIG. 3, the magnetron body 20 includes a target material 22. A first array of magnets is provided comprising a centre magnet 24 and a series of magnets 26 to the rear of the target and mounted in the body and a second array of magnets 28 is provided around the periphery of the target 22. There is also provided a shield 34 which prevents the build up of contaminants in the area, a dual purpose buffer between the cathode potential, the target 22, and the earthed body 38 of the device is provided, which also serves as a retainer for the magnet array 28.

In use the magnets of at least the second array of magnets are held in an insulating material and so in use they are provided with a floating potential or electrically grounded, with the target acting as the cathode of the magnetron during use. The provision of the magnets in this arrangement is convenient, and allows the magnetron to be operated without concern of the value of the magnets potential at that instant affecting the operation of the same.

The shield 34 additionally prevents the oxidation and contamination of the area adjacent the periphery of the target material. In a further feature of the invention the magnetron body 20 and the target insulator 36 are manufactured from an insulating material such as DELRIN™ and, when clamped together, serve to insulate the live part of the magnetron which includes the target and the mounting plate therefor from the external surfaces of the magnetron thereby allowing handling of the magnetron by the operator even when live without the risk of electric shock. The connection 27 serves as a power connector to the magnetron target 22.

Thus the invention and various aspects of the same according to this application provide a substantial improvement in the operation of magnetrons, and in the quality of coating which can be created, and the efficiency of operation of the same. It is envisaged that the magnetron of this invention is particularly suited for use in apparatus for the sputter deposition of material onto substrates held in a chamber in which a vacuum is created. The apparatus of this sort comprises a chamber, a holder for a plurality of substrates movably mounted within the chamber, a means for creating a vacuum in the chamber, and at least one of the magnetrons according to the present invention with first and second arrays of magnets and a target of material arranged to be sputter deposited onto the substrates by operation of the magnetron. In one embodiment the apparatus includes two of said magnetrons, each provided with a target of a material to be sputter deposited onto the substrates, which are typically opthalmic lenses, to form a multilayered coating thereon.

Thus the improvements in repeated use of apparatus of this type and of other similar types of apparatus and for other uses is considerable and reduces the downtime of the apparatus and wastage of material.

What is claimed is:

1. A sputtering magnetron comprising:

a body including a target mounted thereon, the target being formed of a material to be sputtered therefrom and including a front, a rear, and opposite sides, the opposite sides defining a periphery;

a first array of magnets provided for creating a magnetic field, when activated, across a surface of the target material facing a direction in which the material is to be sputtered, the first array of magnets being located to the rear of the target;

a second array of magnets located adjacent the sides and the periphery of the target and spaced along the periphery of said target, said second array of magnets being provided in a side wall of the body of the magnetron and extending at least partially beyond the front of the target lies;

said first array of magnets and said second array of magnets being fixed in relation to the target said first array of magnets and said second array of magnets creating a magnetic field that extends substantially across the surface of the target material to form a substantially uniform effect such that, upon activation, the target material erodes in a substantially uniform manner across the surface;

the first array of magnets comprising a center magnet and a series of magnets arranged around said center magnet, wherein north/south axes of the magnets in the first array of magnets are substantially perpendicular to north/south axes of the magnets in the second array of magnets which are arranged to lie substantially parallel to the front of the target.

2. A magnetron according to claim 1 characterized in that the magnets in the second array of magnets are provided at spaced intervals around the periphery of the target and the spacing is determined by the strength of the magnets provided and the shape and surface area of the target.

3. A magnetron according to claim 1 characterized in that the center magnet in the first array of magnets is arranged with a first polarity in relation to the target, and a series of magnets are arranged around the center magnet and are arranged with reverse polarity in relation to the target, the magnets in the second array of magnets being arranged with the same polarity in relation to the target as the said series of magnets of the first array of magnets.

4. A magnetron according to claim 1 wherein the magnets of the second array of magnets are mounted in insulating material.

5. A magnetron according to claim 1 wherein the magnets in the second array of magnets are grounded in relation to the target.

6. A magnetron according to claim 5 wherein the magnets in the second array of magnets are enclosed by a shield, which is grounded, thereby grounding said magnets in the second array of magnets during use.

7. A magnetron according to claim 1 characterized in that the magnetron has a body comprising two parts, the target material is mounted between the two parts of the body of the magnetron, both of which are insulated and to which a power connection is provided such that no live exposure of the parts of the body occurs and the parts of the body can be safely touched during operation.

8. A magnetron according to claim 1 characterized in that the body of the magnetron includes an earthed shield, which is mounted to the front of the material to prevent build-up of sputtered material both around the periphery of the target and the body of the magnetron.

* * * * *